(12) United States Patent
Kanegsberg

(10) Patent No.: US 7,282,910 B1
(45) Date of Patent: Oct. 16, 2007

(54) NUCLEAR MAGNETIC RESONANCE GYROSCOPE

(75) Inventor: Edward Kanegsberg, Pacific Palisades, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/406,586

(22) Filed: Apr. 19, 2006

(51) Int. Cl.
*G01V 3/00* (2006.01)

(52) U.S. Cl. ...................... 324/304; 324/300

(58) Field of Classification Search ........ 324/300–322; 600/410–445
See application file for complete search history.

(56) References Cited

U.S. PATENT DOCUMENTS

| | | | | |
|---|---|---|---|---|
| 4,157,495 A | * | 6/1979 | Grover et al. | 324/302 |
| 4,430,616 A | * | 2/1984 | Grover | 324/304 |
| 4,450,407 A | * | 5/1984 | Kwon et al. | 324/304 |
| 4,461,996 A | * | 7/1984 | Kwon | 324/315 |
| 4,525,672 A | * | 6/1985 | Lam et al. | 324/304 |
| 6,241,966 B1 | * | 6/2001 | Albert et al. | 424/9.3 |

* cited by examiner

*Primary Examiner*—Brij B. Shrivastav
(74) *Attorney, Agent, or Firm*—Carmen B. Patti & Assoc. LLC

(57) ABSTRACT

A method comprises the steps of providing a nuclear magnetic resonance cell with first, second, and third nuclear moment gases and at least one optically pumpable substance; obtaining first, second, and third measured precession frequencies that correspond to the first, second, and third nuclear moment gases, wherein the first, second, and third measured precession frequencies are altered from corresponding first, second, and third Larmor precession frequencies by a rotational rate and corresponding first, second, and third local magnetic fields; and determining the rotational rate with compensation for the first, second, and third local magnetic fields through employment of the first, second, and third measured precession frequencies.

19 Claims, 1 Drawing Sheet

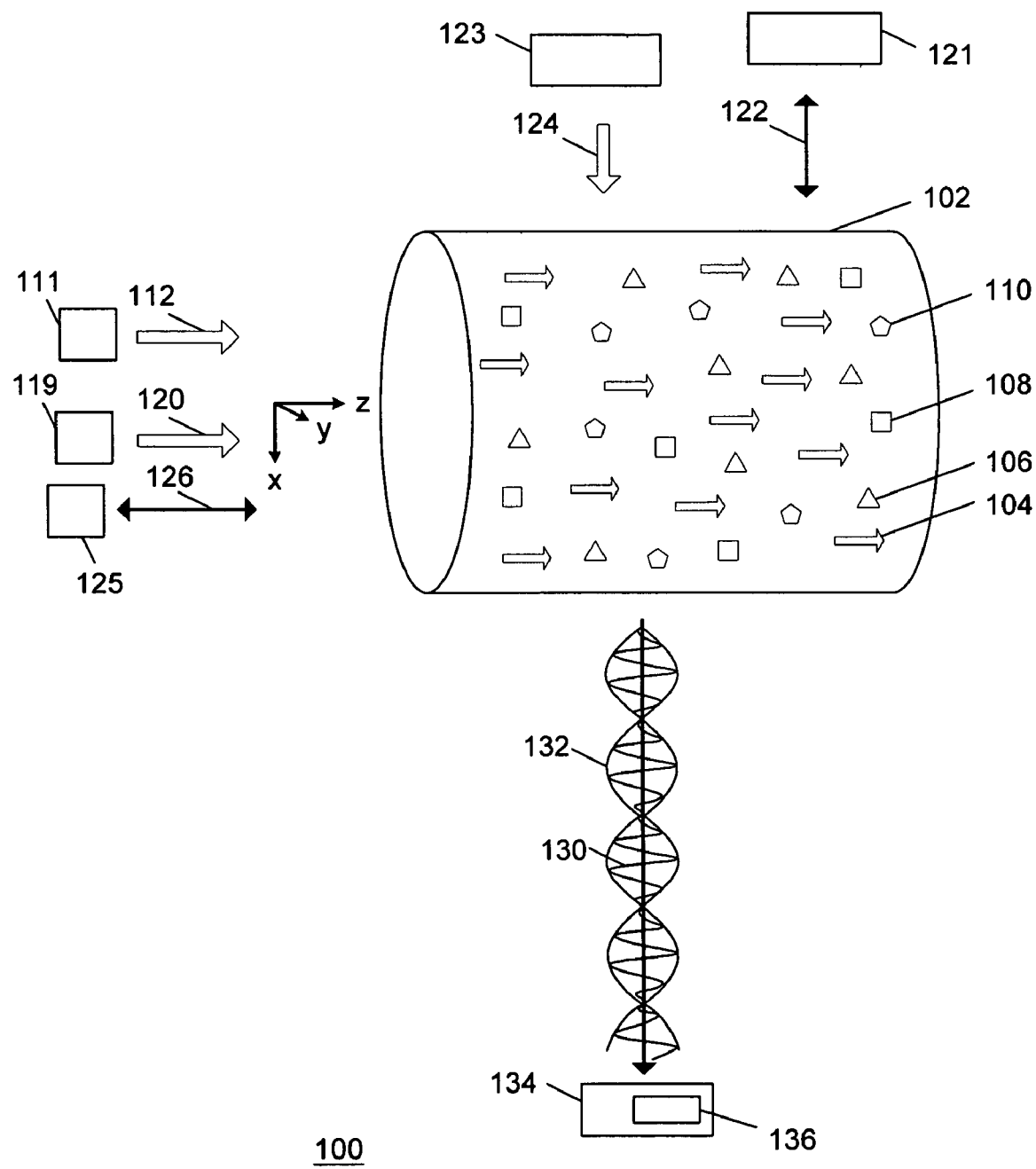

NUCLEAR MAGNETIC RESONANCE GYROSCOPE

TECHNICAL FIELD

The invention relates generally to nuclear magnetic resonance and more particularly to nuclear magnetic resonance gyroscopes.

BACKGROUND

A nuclear magnetic resonance (hereinafter referred to as NMR) angular rate sensor or gyroscope is described in U.S. Pat. No. 4,157,495, the disclosure of which is hereby incorporated by reference into this document. A NMR gyroscope operates on the principle of sensing inertial angular rotation rate or angular displacement about a sensitive axis of the device as a shift in the Larmor precession frequency or phase, respectively, of one or more isotopes that possess nuclear magnetic moments.

The gyroscope is composed of an angular rotation sensor and associated electronics. The principal elements of the sensor are a light source, an NMR cell, a photodetector, a set of magnetic shields and a set of magnetic field coils. The principal elements of the electronics are signal processing circuits for extracting the Larmor precession frequency and phase information as well as circuits for generating and controlling various magnetic fields, both steady and varying sinusoidally with time, that are necessary for the proper operation of the device.

The NMR cell is mounted within a set of magnetic shields in order to attenuate external magnetic fields to acceptable low levels. Magnetic field coils are used to apply very uniform magnetic fields to the NMR cell. Both a steady field and an ac carrier field are applied along the sensitive axis of the device and AC feedback fields are applied along one of the transverse axes. The DC magnetic fields along both transverse axes are controlled to be substantially zero. The NMR cell contains one or more alkali metal vapors, such as rubidium, together with two isotopes of one or more noble gases, such as krypton-83, and xenon-129, or xenon-131. One or more buffer gases such as helium and nitrogen may also be contained in the cell. The NMR cell is illuminated by a beam of circularly polarized light that originates from a source such as a rubidium lamp and which passes through the cell at an angle with respect to the steady magnetic field. Absorption of some of this light causes the atomic magnetic moments of the rubidium atoms to be partly aligned in the direction of the steady magnetic field. This alignment is partly transferred to the nuclear magnetic moments of the noble gases, and these moments are caused to precess about the direction of the steady magnetic field, which in turn creates magnetic fields that rotate at the respective Larmor precession frequencies of the two noble gases. These rotating fields modulate the precessional motions of the rubidium magnetic moments, which in turn produce corresponding modulations of the transmitted light, thereby making it possible to optically detect the Larmor precession frequencies of the two noble gases.

The modulations of the light intensity are converted into electrical signals by a photodetector, and these signals are then electronically demodulated and filtered to provide signals at the Larmor precession frequencies of the two noble gases. The difference between the two precession frequencies is used to accurately control the steady magnetic field so that it is constant. One of the noble gas precession frequencies is subtracted from a precision reference frequency. The resulting difference frequency is a measure of the angular rotation rate of the gyroscope. The magnitude of an individual nuclear magnetic moment is extremely small and the natural equilibrium condition is one in which a nearly random orientation of moments exists in an ensemble of atoms. Techniques must be used to orient a significant fraction of these magnetic moments in a single direction so that a macroscopic magnetic moment, and consequently a measurable signal, will be produced.

SUMMARY

The invention in one implementation encompasses a method. A nuclear magnetic resonance cell with first, second, and third nuclear moment gases and at least one optically pumpable substance is provided. First, second, and third measured precession frequencies that correspond to the first, second, and third nuclear moment gases are obtained. The first, second, and third measured precession frequencies are altered from corresponding first, second, and third Larmor precession frequencies by a rotational rate and corresponding first, second, and third local magnetic fields. The rotational rate is determined with compensation for the first, second, and third local magnetic fields through employment of the first, second, and third measured precession frequencies.

Another implementation of the invention encompasses an apparatus. The apparatus comprises a nuclear magnetic resonance cell and a photodetector. The nuclear magnetic resonance cell comprises first, second, and third nuclear moment gases and at least one optically pumpable substance. The nuclear magnetic resonance cell receives detection light that passes through the nuclear magnetic resonance cell. The first, second, and third nuclear moment gases and the at least one optically pumpable substance cooperate to modulate the detection light based on local magnetic fields and pass transmitted light to the photodetector. The photodetector receives the transmitted light through the nuclear magnetic cell and determines a rotational rate with compensation for the first, second, and third local magnetic fields.

DESCRIPTION OF THE DRAWINGS

Features of various implementations of the invention will become apparent from the description, the claims, and the accompanying drawings in which:

The FIGURE is a representation of one implementation of an apparatus that comprises a nuclear magnetic resonance cell and a photodetector.

DETAILED DESCRIPTION

The nuclear magnetic resonance ("NMR") gyro disclosed in U.S. Pat. No. 4,157,495 employs two noble gas species as rotation detectors based on the following equations of precession:

$$\omega_1 = \gamma_1 H - \Omega \tag{1}$$

$$\omega_2 = \gamma_2 H - \Omega \tag{2}$$

where the subscripts refer to one or the other of the noble gas species, and where H is the applied magnetic field, $\gamma$ is the gyromagnetic ratio for the noble gas nuclear spin, $\Omega$ is the vehicle rotation rate and $\omega$ is the measured precession frequency.

Since equations (1) and (2) are a system of linear equations with two unknowns, H and $\Omega$, unique solutions, depending only on the measured precession frequencies $\omega$ and constants $\gamma$, can be found for both H and $\Omega$. Implicit in equations (1) and (2) is the assumption that the magnetic field "experienced" by both nuclear spin systems is the same.

In the practice of the NMR gyro, however, this assumption of both systems experiencing the same field is not quite true. During interactions (e.g., collisions) between a noble gas atom and an alkali, there are small local magnetic fields. The macroscopic effect of these fields depends on both the spin polarization of the alkali and on the collision rate. The spin polarization is light dependent and the collision rate is temperature dependent due to vapor pressure of the alkali. These collision-based fields are also dependent on the noble gas and alkali isotope, leading to different effective magnetic fields for each nuclear species present. Accordingly, equations (1) and (2) can be modified to:

$$\omega_1 = \gamma_1(H+h_1) - \Omega \quad (3)$$

$$\omega_2 = \gamma_2(H+h_2) - \Omega \quad (4)$$

where $h_1$ and $h_2$ are the local collisional fields and in general $h_1 \neq h_2$. The thermal and light intensity dependence of $h_1$ and $h_2$ lead to perturbations to $\omega_1$ and $\omega_2$, which cause gyro bias errors. At first, it appears that this is a system of two equations with four unknowns: H, $h_1$, $h_2$, and $\Omega$. However, $h_1$ and $h_2$ are related to each other because both are due to interactions with the same alkali atom system. The fields $h_1$ and $h_2$ are both proportional to the frequency of alkali atomic collisions which is proportional to alkali density and alkali spin polarization with a constant of proportionality that depends on which nuclear specie is interacting with the alkali. The alkali density is temperature dependent and the alkali spin polarization is light dependent. Accordingly, equations (3) and (4) can be rewritten as:

$$\omega_1 = \gamma_1 H + b_1 c - \Omega \quad (5)$$

$$\omega_2 = \gamma_2 H + b_2 c - \Omega \quad (6)$$

where $b_1 c = \gamma_1 h_1$ and $b_2 c = \gamma_2 h_2$ and where c is a function of the alkali density and alkali spin polarization and is not a function of which nuclear specie is being considered. The proportionality factor b will be a constant with a different value for each nuclear specie.

Adding a third nuclear specie and thus a third equation does not introduce any more unknown variables:

$$\omega_3 = \gamma_3 H + b_3 c - \Omega \quad (7)$$

Equations 5, 6, and 7 comprise a system of three linear equations in three unknown variables H, c, and $\Omega$ so there are unique solutions. Solving for each unknown variable as functions of the measurable frequencies $\omega$ and known or calibratable constants results in:

$$H = \frac{(\omega_1 - \omega_2)(b_2 - b_3) - (\omega_2 - \omega_3)(b_1 - b_2)}{(\gamma_1 - \gamma_2)(b_2 - b_3) - (\gamma_2 - \gamma_3)(b_1 - b_2)} \quad (8)$$

$$c = \frac{(\omega_1 - \omega_2)(\gamma_2 - \gamma_3) - (\omega_2 - \omega_3)(\gamma_1 - \gamma_2)}{(\gamma_2 - \gamma_1)(b_1 - b_2) - (\gamma_1 - \gamma_2)(b_2 - b_3)} \quad (9)$$

$$\Omega = \gamma_1 H + b_1 c - \omega_1 \quad (10)$$

The parameters $\gamma$ and b can be obtained during gyro calibration and entered into an operational system model. The dependency of $\gamma$ can be determined by observing the effects of a changing magnetic field. The dependency of b can be determined by observing the effects of a changing temperature and light level.

Turning to the FIGURE, an apparatus 100 in one example comprises a nuclear magnetic resonance ("NMR") gyroscope. The apparatus 100 comprises a NMR cell 102, a pumping light generator 111, a steady magnetic field generator 119, a feedback magnetic field generator 121, a detection light generator 123, a carrier magnetic field generator 125, and a photodetector 134. The NMR cell 102 comprises at least one optically pumpable substance, for example, an alkali metal vapor 104. The NMR cell 102 also comprises first, second, and third nuclear magnetic moment gases 106, 108, and 110. The alkali metal vapor 104 in one example comprises rubidium. The nuclear magnetic moment gases 106, 108, and 110 in one example comprise isotopes of noble gases such as xenon and/or krypton. The NMR cell 102 in a further example comprises at least one buffer gas, such as helium or nitrogen. The photodetector 134 in one example comprises an instance of a computer-readable signal bearing medium 136.

An illustrative description of operation of the apparatus 100 is presented, for explanatory purposes. The pumping light generator 111 directs optical pumping light 112 into the NMR cell 102 along the z-axis. The optical pumping light 112 in one example comprises circularly polarized light. The steady magnetic field generator 119 applies a steady magnetic field 120 along the z-axis. The optical pumping light 112 and the steady magnetic field 120 cooperate to align magnetic moments of atoms of the alkali metal vapor 104 in the z-direction. The atoms of the alkali metal vapor 104 transfer the magnetic moment alignment to nuclei of the nuclear magnetic moment gases 106, 108, and 110 through interatomic collisions.

The feedback magnetic field generator 121 applies a sinusoidal AC feedback magnetic field 122 in the x-direction and serves to torque the magnetic moment of the nuclear magnetic moment gases 106, 108, and 110 to the x-y plane. The sinusoidal AC feedback magnetic field 122 comprises three feedback signals of different frequencies that are superimposed, for example, one feedback signal per nuclear magnetic moment gas. The frequency and phase of each signal are matched to a Larmor precession frequency of collective magnetic moments of the respective nuclear magnetic moment gases 106, 108, and 110. The collective magnetic moments of the nuclear magnetic moment gases 106, 108, and 110 then precess in the x-y plane at their Larmor precession frequencies $\omega_{a1}$, $\omega_{a2}$, and $\omega_{a3}$ about the steady magnetic field 120. The precessing nuclear magnetic moments create nuclear precession magnetic fields of strength $h_{a1}$, $h_{a2}$, and $h_{a3}$ that rotate in the x-y plane and which therefore have a component in the y-direction that is equal to $h_a \cos \omega_a t$.

The detection light generator 123 directs detection light 124 through the nuclear magnetic resonance cell. The detection light 124 interacts with the atoms of the alkali vapor 104, which are under the influence of the steady magnetic field 120, a superimposed AC carrier magnetic field 126, and the y-component of the nuclear precession fields $h_a$. The carrier magnetic field generator 125 applies the superimposed AC carrier magnetic field 126. The superimposed AC carrier magnetic field comprises a frequency of $\omega$, which is close to the Larmor precession frequency for an alkali magnetic moment of the alkali metal vapor 104. This interaction of the detection light 124 and the alkali vapor 104 causes the intensity of the x-component of transmitted light 130 to be modulated at the precession frequency $\omega$, with a modulation envelope 132 at the nuclear precession frequencies $\omega_a$ ($\omega_{a1}$, $\omega_{a2}$, and $\omega_{a3}$). For example, the transmitted light 130 comprises the superimposed AC carrier magnetic field that comprises the nuclear precession frequencies $\omega_a$ as sidebands. The silicon photodetector 134 receives the transmitted light 130 and converts the transmitted light 130 into electrical signals.

The silicon photodetector 134 in one example processes the electrical signals to obtain angular rate information for the apparatus 100. For example, the silicon photodetector 134 employs one or more of equations (5)-(10) to determine the angular rate information where $\omega_a$ (e.g., $\omega_{a1}$, $\omega_{a2}$, $\omega_{a3}$) is the measured precession frequency. The computer-readable signal bearing medium 136 of the silicon photodetector 134 in one example comprises software, firmware, and/or other executable code for processing the electrical signals.

The apparatus 100 in one example comprises a plurality of components such as one or more of electronic components, hardware components, and computer software components. A number of such components can be combined or divided in the apparatus 100. One or more components of the apparatus 100 may employ and/or comprise a set and/or series of computer instructions written in or implemented with any of a number of programming languages, as will be appreciated by those skilled in the art.

The apparatus 100 in one example employs one or more computer-readable signal-bearing media. The computer-readable signal-bearing media store software, firmware and/or assembly language for performing one or more portions of one or more implementations of the invention. Examples of a computer-readable signal-bearing medium for the apparatus 100 comprise the recordable data storage medium 136 of the silicon photodetector 134. The computer-readable signal-bearing medium for the apparatus 100 in one example comprise one or more of a magnetic, electrical, optical, biological, and atomic data storage medium. For example, the computer-readable signal-bearing medium comprise floppy disks, magnetic tapes, CD-ROMs, DVD-ROMs, hard disk drives, and electronic memory. In another example, the computer-readable signal-bearing medium comprises a modulated carrier signal transmitted over a network comprising or coupled with the apparatus 100, for instance, one or more of a telephone network, a local area network ("LAN"), a wide area network ("WAN"), the Internet, and a wireless network.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A method, comprising the steps of:
   providing a nuclear magnetic resonance cell with first, second, and third nuclear moment gases and at least one optically pumpable substance;
   obtaining first, second, and third measured precession frequencies that correspond to the first, second, and third nuclear moment gases, wherein the first, second, and third measured precession frequencies are altered from corresponding first, second, and third Larmor precession frequencies by a rotational rate, an applied magnetic field, and corresponding first, second, and third local magnetic fields; and
   determining a base magnetic field as a function based on the at least one optically pumpable substance;
   approximating the first, second, and third local magnetic fields as the base magnetic field multiplied by corresponding first, second, and third proportionality factors;
   determining the rotational rate with compensation for the first, second, and third local magnetic fields through employment of:
   the first, second, and third measured precessing frequencies;
   the base magnetic field;
   the first, second, and third proportionality factors; and
   the applied magnetic field.

2. The method of claim 1, wherein the step of determining the base magnetic field as the function based on the at least one optically pumpable substance comprises the step of:
   determining the base magnetic field as a function of density of the at least one optically pumpable substance and spin polarization of the at least one optically pumpable substance.

3. The method of claim 2, wherein the step of approximating the first, second, and third local magnetic fields as the base magnetic field multiplied by the first, second, and third proportionality factors comprises the steps of:
   modeling the first measured precession frequency as:

$$\omega_1 = \gamma_1 H + b_1 c - \Omega$$

modeling the second measured precession frequency as:

$$\omega_2 = \gamma_2 H + b_2 c - \Omega$$

modeling the third measured precession frequency as:

$$\omega_3 = \gamma_3 H + b_3 c - \Omega$$

where $\omega_n$ is the measured precession frequency for the three nuclear moment gases, $\gamma_n$ is a gyromagnetic ratio for nuclear spin for the three nuclear moment gases, H is the applied magnetic field, $b_n$ is the proportionality factor for the three nuclear moment gases, c is the base magnetic field, and $\Omega$ is the rotational rate information.

4. The method of claim 3, further comprising the steps of:
   determining the gyromagnetic ratios for nuclear spin for the three nuclear moment gases $\gamma_n$ and the proportionality factor b through calibration.

5. The method of claim 4, wherein the step of determining the gyromagnetic ratios for nuclear spin for the three nuclear moment gases $\gamma_n$ and the proportionality factors $b_n$ through calibration comprises the step of:
   adjusting the applied magnetic field to determine the gyromagnetic ratios for nuclear spin for the three nuclear moment gases $\gamma_n$.

6. The method of claim 4, wherein the step of determining the gyromagnetic ratios for nuclear spin for the three nuclear moment gases $\gamma_n$ and the proportionality factor b through calibration comprises the step of:
   adjusting a temperature within the nuclear magnetic resonance cell to determine the proportionality factors $b_n$.

7. The method of claim 4, wherein the step of determining the gyromagnetic ratios for nuclear spin for the three nuclear moment gases $\gamma_n$ and the proportionality factor b through calibration comprises the step of:
   adjusting a light level within the nuclear magnetic resonance cell to determine the proportionality factors $b_n$.

8. The method of claim 4, wherein the step of determining the gyromagnetic ratios for nuclear spin for the three nuclear moment gases $\gamma_n$ and the proportionality factor b through calibration comprises the step of:

adjusting a temperature within the nuclear magnetic resonance cell and a light level within the nuclear magnetic resonance cell to determine the proportionality factors $b_n$.

9. The method of claim 4, further comprising the step of determining the rotational rate information as:

$\Omega = \gamma_1 H + b_1 c - \omega_1$ where $$H = \frac{(\omega_1 - \omega_2)(b_2 - b_3) - (\omega_2 - \omega_3)(b_1 - b_2)}{(\gamma_1 - \gamma_2)(b_2 - b_3) - (\gamma_2 - \gamma_3)(b_1 - b_2)} \text{ and}$$

$$c = \frac{(\omega_1 - \omega_2)(\gamma_2 - \gamma_3) - (\omega_2 - \omega_3)(\gamma_1 - \gamma_2)}{(\gamma_2 - \gamma_1)(b_1 - b_2) - (\gamma_1 - \gamma_2)(b_2 - b_3)}.$$

10. An apparatus, comprising:

a nuclear magnetic resonance cell; and a photodetector;

wherein the nuclear magnetic resonance cell comprises first, second, and third nuclear moment gases and at least one optically pumpable substance;

wherein the nuclear magnetic resonance cell receives detection light that passes through the nuclear magnetic resonance cell;

wherein the first, second, and third nuclear moment gases and the at least one optically pumpable substance cooperate to modulate the detection light based on an applied magnetic field and local magnetic fields and pass transmitted light to the photodetector;

wherein the photodetector receives the transmitted light through the nuclear magnetic cell and determines a rotational rate with compensation for the first, second, and third local magnetic fields by approximating the first, second, and third local magnetic fields as a base magnetic field multiplied by corresponding first, second, and third proportionality factors.

11. The apparatus of claim 10, wherein the at least one optically pumpable substance comprises an alkali vapor.

12. The apparatus of claim 11, wherein the alkali vapor comprises rubidium.

13. The apparatus of claim 10, wherein at least one of the first, second, and third nuclear moment gases comprise isotopes of at least one noble gas.

14. The apparatus of claim 13, wherein the at least one noble gas comprises krypton-83, xenon-129, or xenon-131.

15. The apparatus of claim 10, wherein the nuclear magnetic resonance cell comprises at least one buffer gas of helium or nitrogen.

16. The apparatus of claim 10, further comprising:

a pumping light generator that directs circularly polarized optical pumping light through the nuclear magnetic resonance cell;

a steady magnetic field generator that applies the applied magnetic field along a z-axis of the nuclear magnetic resonance cell;

a feedback magnetic field generator that applies a sinusoidal AC feedback magnetic field in an x-direction of the nuclear magnetic resonance cell;

a detection light generator that directs detection light through the nuclear magnetic resonance cell, wherein the detection light comprises a wavelength approximately equal to a wavelength which can be absorbed by the at least one optical pumpable substance; and a carrier magnetic field generator that applies a superimposed AC carrier magnetic field.

17. The apparatus of claim 16, wherein the sinusoidal AC feedback magnetic field comprises first, second, and third feedback signals of different frequencies;

wherein the feedback magnetic field generator superimposes the first, second, and third feedback signals.

18. The apparatus of claim 17, wherein the feedback magnetic field generator matches a frequency and phase of the first feedback signal with a Larmor precession frequency of the first nuclear moment gas;

wherein the feedback magnetic field generator matches a frequency and phase of the second feedback signal with a Larmor precession frequency of the second nuclear moment gas;

wherein the feedback magnetic field generator matches a frequency and phase of the third feedback signal with a Larmor precession frequency of the third nuclear moment gas.

19. The apparatus of claim 18, wherein the superimposed AC carrier magnetic field comprises a frequency $\omega$ that is close to a Larmor precession frequency of the at least one optically pumpable substance.

* * * * *